United States Patent [19]

Novini

[11] Patent Number: 5,256,960
[45] Date of Patent: Oct. 26, 1993

[54] PORTABLE DUAL BAND ELECTROMAGNETIC FIELD RADIATION MEASUREMENT APPARATUS

[76] Inventor: Amir R. Novini, 600 N. Hametown Rd., Akron, Ohio 44333

[21] Appl. No.: 682,696

[22] Filed: Apr. 9, 1991

[51] Int. Cl.⁵ .................. G01R 33/02; G01R 29/08; G01R 31/02; G01R 13/00
[52] U.S. Cl. .................. 324/72; 324/115; 324/128; 324/247; 324/258; 324/260; 340/600
[58] Field of Search .................. 324/67, 72, 95, 115, 324/126-128, 133, 244, 247, 258, 260, 326, 345; 340/547, 551, 600; 128/653; 455/226.2, 226.4

[56] References Cited

U.S. PATENT DOCUMENTS

| | | | |
|---|---|---|---|
| 2,879,382 | 3/1959 | Freen | 324/115 X |
| 3,789,834 | 2/1974 | Doroux | 128/2.12 |
| 3,905,121 | 9/1975 | Takeda | 324/247 X |
| 3,984,758 | 10/1976 | Millon | 324/335 X |
| 4,198,596 | 4/1980 | Waeselynck et al. | 324/335 X |
| 4,245,649 | 1/1981 | Schmidt-Andersen | 128/696 |
| 4,277,744 | 7/1981 | Audone et al. | 324/72 |
| 4,277,745 | 7/1981 | Deno | 324/72 |
| 4,634,969 | 1/1987 | Edlin et al. | 324/258 X |
| 4,635,207 | 1/1987 | Payne | 324/247 X |
| 4,672,309 | 6/1987 | Gandhi | 324/95 |
| 4,714,915 | 12/1987 | Hascal et al. | 340/657 |
| 4,724,390 | 2/1988 | Rauscher et al. | 324/258 X |
| 4,813,789 | 3/1989 | Olsen | 374/32 |
| 4,818,944 | 4/1989 | Rippingale | 324/67 X |
| 4,913,153 | 4/1990 | Hagmann et al. | 128/653 |
| 4,951,674 | 8/1990 | Zanakis et al. | 128/653 |
| 5,006,788 | 4/1991 | Goulette et al. | 324/95 |
| 5,150,051 | 9/1992 | Friedman et al. | 324/258 |

OTHER PUBLICATIONS

Metz, Reinhard; "Build This Magnetic Field Meter" published in Radio Electronics-Apr. 1991 issue pp. 33-37 and 42.

Primary Examiner—Gerard R. Strecker
Attorney, Agent, or Firm—Oldham, Oldham & Wilson Co.

[57] ABSTRACT

The invention discloses a magnetic field radiation monitor which comprises at least one sense coil adapted to sense magnetic flux from the electromagnetic field to be measured for both ELF and VLF type of fields. The sense coil is coupled to a detection circuit wherein an EMF generated in the sense coil will be amplified and frequency compensated in the circuit to give an extremely flat frequency response allowing accurate detection of complex magnetic fields. The circuit consists of an ELF and VLF stage, both selectively coupled to the sense coil and incorporated into the circuit by a user activated switch. The output of either the ELF or VLF stages is further processed and the output is provided to a display to indicate the magnetic field strength measured. The magnetic field radiation monitor may be calibrated to yield a true RMS measuring platform using a RMS detector circuit which will give an accurate indication of magnetic energy content for complex waveforms. An isotropic monitor may be provided where the configuration of the sense coil is designed to provide a non-directional magnetic sensor and appropriate detection circuitry to determine the total magnetic flux density detected by the magnetic sensor. The isotropic magnetic field radiation monitor will simplify use of the apparatus and will provide more accurate electromagnetic field measurements while maintaining the cost effectiveness of the apparatus.

22 Claims, 6 Drawing Sheets

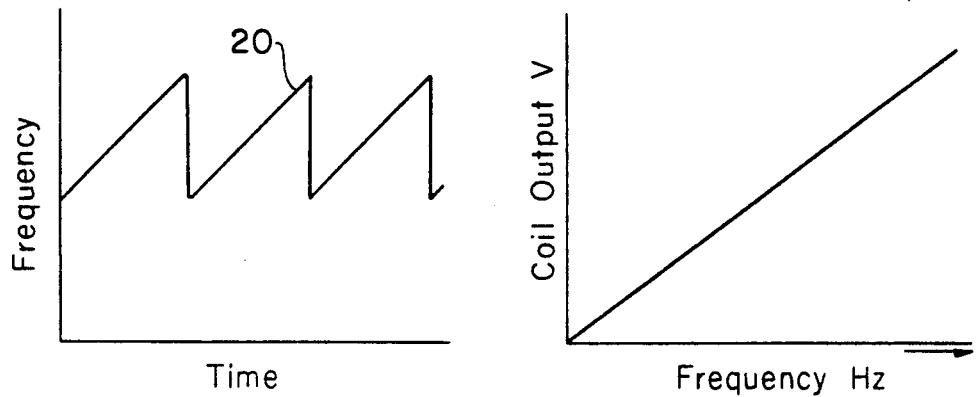
FIG.-3
FIG.-5
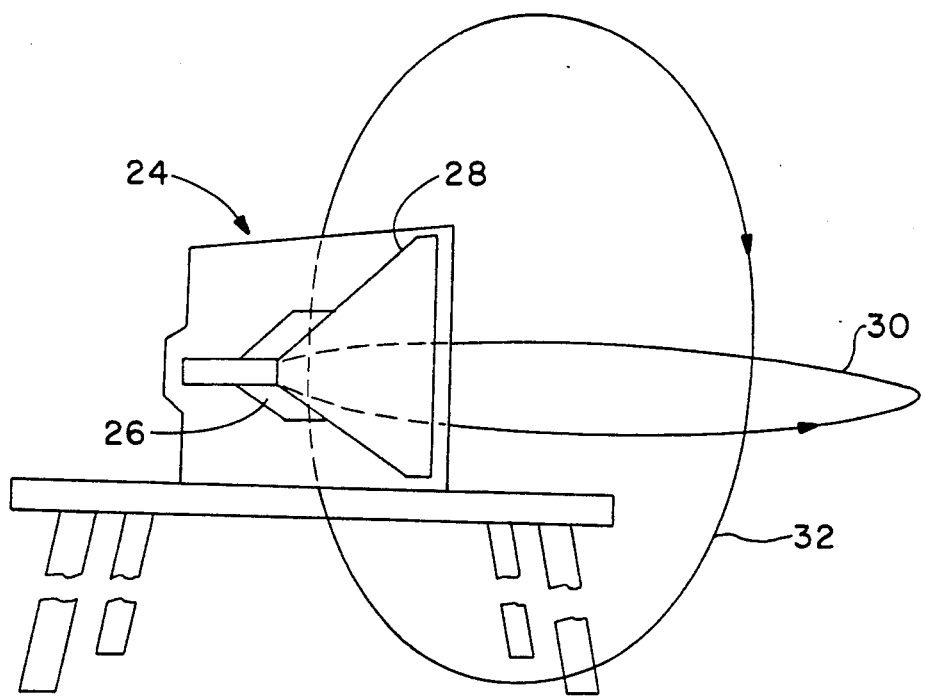
FIG.-4

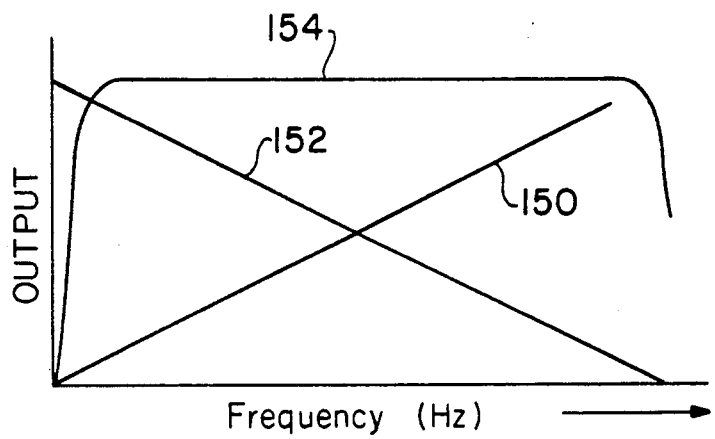
FIG.-9
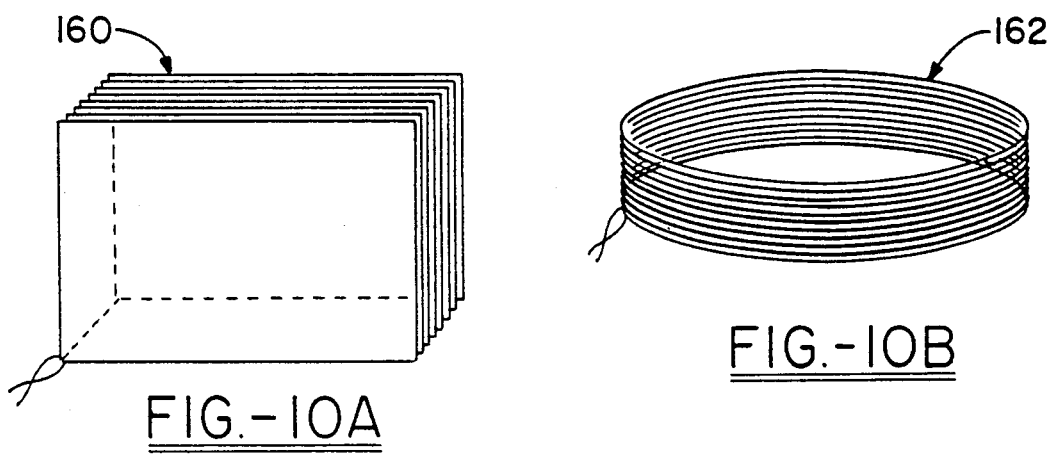
FIG.-10A
FIG.-10B
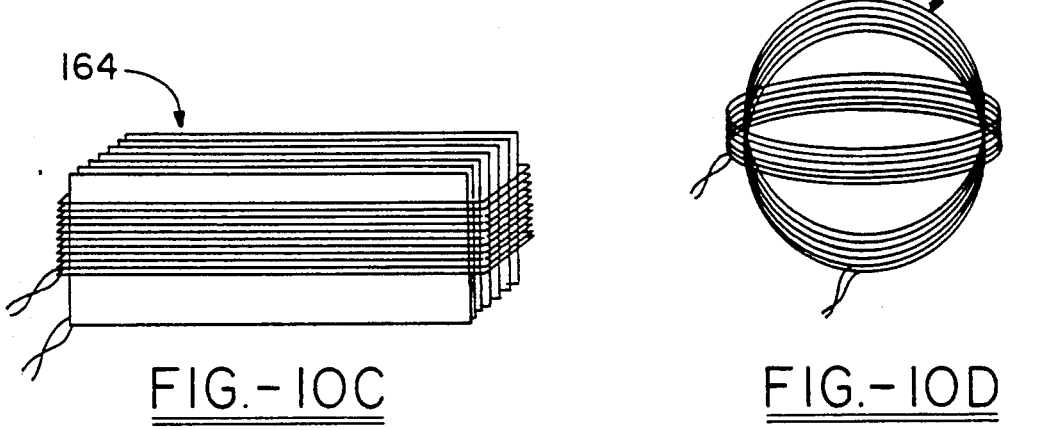
FIG.-10C
FIG.-10D

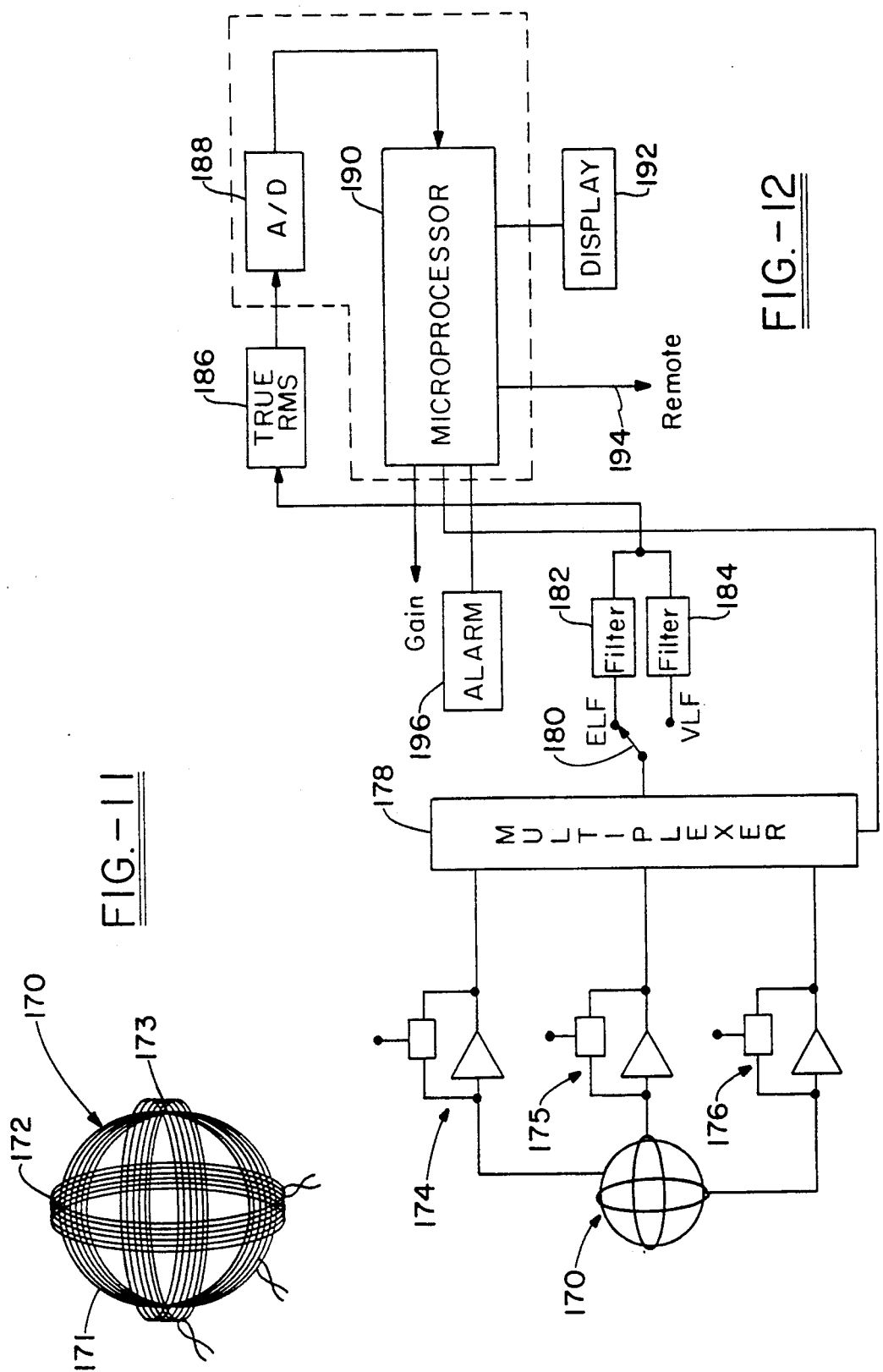

PORTABLE DUAL BAND ELECTROMAGNETIC FIELD RADIATION MEASUREMENT APPARATUS

BACKGROUND OF INVENTION

This invention generally relates to an apparatus for detecting and measuring low frequency pulsed/alternating magnetic fields to which a person may be exposed, and which may create a health hazard at high or continued exposure levels. More particularly, the invention relates to a magnetic and electric field radiation monitor which is compact and easily used to allow the device to be easily carried to various locations and environments in which a person may be exposed to such radiation. The monitor allows the detection and the measurement of magnetic and electric fields emitted from various electronic equipment and the like, such that the location and strength of the fields may be determined to allow reduction of personal exposure to such fields.

Recently, the effects of pulsed/alternating magnetic fields emitted from such things as video display terminals (VDT's), television receivers, microwave ovens, power lines or a variety of other devices which emit pulsed/alternating magnetic fields, have been linked to increased health risks for persons exposed to such fields. The potentially harmful health effects of electromagnetic emissions from this various electronic equipment include an increased risk of developing cancer, risks of birth defects and miscarriages in pregnant women, and other health hazards. The evidence of such health risks has been increasing dramatically within the last few years, and recognition of the problem is slowly being acknowledged within the industry and community. The epidemiological evidence being gathered on the hazardous effects of electromagnetic fields given off by various electronic equipment has been mounting. This evidence has led to various responses initiated by manufacturers of equipment emitting potentially harmful electromagnetic radiation, as well as by governmental authorities who have imposed restrictions upon emissions from various equipment to minimize the risk posed thereby. Various editorials and articles provide general background information on the potential risks of the low frequency pulsed/alternating magnetic fields emitted from various electronic equipment, such as found in *MACWORLD*, July 1990 issue at page 136, *POPULAR MECHANICS*, November 1990 issue at page 110 as well as others. Although these articles have raised the public awareness about the possible dangers of low frequency electromagnetic fields or radiation, the industry has not yet responded in an adequate fashion to provide individual protection to the user of such equipment.

The magnetic fields which are deemed a potential health hazard are normally generated from power lines and other high-voltage electrical apparatus, which emit extremely low frequency (ELF) magnetic fields in the 50-1000 Hz range, as well as the higher frequencies termed very low frequency (VLF) emissions in the range of 10-500 KHz. As an example, the ELF magnetic fields emitted by video display monitors were tested as described in the MACWORLD article mentioned hereinbefore, magnetic field emissions were measured at various distances from all portions of various monitors. It was found that the strongest emissions from video display terminals are at the sides and tops of the monitors, wherein the field strength may be as much as 70 milligauss (mG) at a distance of 4" from these areas. Field strengths at the front of the VDT were over 22 mG at the same distance, but at a longer distance such as 28" from the front of the VDT, the emissions dropped to below 1 mG. Although this generalized information would indicate that keeping a safe distance from a VDT or other electromagnetic radiator may minimize the harm of such fields, for any particular environment in which a person may be placed, the exact location and field strength of magnetic field radiation may not be generally surmised. It is also noted that the magnetic field radiation from such electromagnetic radiators may not be shielded by simple shielding structures, and therefore other means must be utilized to minimize emissions from such equipment. Various attempts have been suggested for minimizing the actual emission of pulsed/alternating magnetic fields from such devices, such as a compensating coil placed in a VDT or the like which produces lines of magnetic flux moving in opposition to those generated from the CRT's deflection coil. Also, LCD or electroluminescent displays have been found to emit negligible magnetic fields, and may be resorted to minimize emissions, but such equipment is higher in cost and does not provide similar performance characteristics as CRT technology.

Although the approach of minimizing the emissions from such equipment will be a necessary step to minimize the risk associated with use of such equipment, there is a critical need to provide an individual with the ability to monitor and measure possible emissions of magnetic field radiation so that they themselves may minimize the potential risk of exposure to such fields by positioning themselves to eliminate or minimize such exposure Various types of electromagnetic field measurement apparatus are available, for example, a VDT/VLF Radiation Survey Meter Model HI-3603, which is stated to measure electromagnetic field strengths in the frequency range from 10 KHz to 300 KHz, and an ELF/Power Frequency EMF Survey Meter Model HI-3604 designed to evaluate electric and magnetic fields associated with 50/60 Hz power lines and the like, both manufactured by Holaday Industries, Inc. Another apparatus for electromagnetic field radiation measurement is a digital display field monitor model ELF-50D produced by Walker Scientific Inc., which is a portable, hand-held instrument designed and calibrated to measure low level 50 Hz or 60 Hz electromagnetic field radiation. These and other companies also produce a variety of other gaussmeters, magnetometers and fluxmeters for magnetic field measurement in a variety of different applications including nuclear magnetic resonance applications and other industrial applications.

Generally, these types of instruments as manufactured by these and other companies are designed as laboratory or industrial measurement tools rather than for use by the general public. Such equipment is limited in its application for use by the general consumer as the cost of such instruments are high and therefore impractical and generally unavailable to the individual. Additionally, many of these devices are operationally complex, and again generally unusable by the individual. Various other lower cost devices have been introduced, such as the Walker Scientific Model ELF-50D, which is a portable, hand-held unit and of lower cost, but which is calibrated for a fundamental frequency only and therefore limited to a single frequency response. Any devices of similar type generally suffer from limited or single frequency response, which will prevent the user from achieving a complete or accurate measurement of magnetic fields of a complex nature typically emitted from video display terminals, television receivers and the like. Additionally, such instruments are again difficult in their use to obtain accurate and valid quantitative measurements of magnetic field radiation. Similarly, electric field measurements are desirable in many situations, and accurate field measurements have not been generally achievable with a low cost, easily used device.

SUMMARY OF THE INVENTION

Based upon the foregoing, there has been found a need to provide a personal magnetic or electric field monitor which is low cost, easy to use and will effectively and accurately measure complex electromagnetic and electric fields. It is therefore a main object of the invention to provide a magnetic and electric field radiation monitor which is portable and easily used, and may be manufactured at a low cost so as to be accessible to an individual consumer.

Another object of the invention is to provide a magnetic field radiation monitor which may be used to accurately measure both ELF and VLF pulsed/alternating magnetic fields over a broad frequency spectrum.

Yet another object of the invention is to provide a radiation monitor which is adapted to detect and measure non-ionizing radiation to quantitatively analyze an environment where the potential hazard of pulsed/alternating magnetic fields exists to provide an immediate indication of the magnitude of electromagnetic field radiation to enable the user to avoid exposure to such fields.

Another object of the invention is to provide a magnetic field radiation monitor which utilizes a uniquely designed sense coil which is simple and cost effective in its manufacture, and an associated detection circuit which provides a relatively flat frequency response over a broad frequency bandwidth to enable accurate detection and measurement of complex electromagnetic fields.

Still another object of the invention is to provide an isotropic field radiation measurement device which will simplify use of the device and increase the detection accuracy thereof.

These and other objects and advantages of the invention are accomplished by a radiation monitor which comprises at least one sense coil adapted to sense magnetic flux from the electromagnetic field to be measured for both the ELF and VLF type of fields. The sense coil is coupled to a detection circuit wherein an EMF generated in the sense coil will be amplified and frequency compensated in the circuit. Amplification and frequency compensation may be accomplished by a precision operational amplifier having a feedback loop designed such that the voltage gain of the operational amplifier stage has an output response which is exactly the opposite of the output of the sense coil to yield a relatively flat frequency response. Further amplification may be provided to achieve the proper gain in the circuit. The circuit consists of an ELF and VLF stage, both selectively coupled to the sense coil and incorporated into the circuit by a user activated switch. The ELF and VLF stages are similar in many respects, but the VLF stage includes a frequency filter to shape the frequency response thereof, for rejection signals outside of the desired frequency range. The output of either the ELF or VLF stages may be coupled to a precision rectifier circuit to provide full-wave rectification of the signals to insure accuracy of signal interpretation across a wide signal level range. The frequency response of the precision rectifier circuit will be broad enough to accommodate both the ELF and VLF range, thereby minimizing circuit components and complexity. Further signal processing is then performed and the output is provided to a display to indicate the magnetic field strength measured. The magnetic field radiation monitor may be calibrated to yield RMS indications for non-complex signals and average indications for complex signals. Further processing in the circuit may include an RMS detector circuit which will give an accurate indication of magnetic energy content for complex wave forms. An isotropic monitor may be provided where the configuration of the sense coil is designed to provide a non-directional magnetic sensor and appropriate detection circuitry to determine the total magnetic flux density detected by the magnetic sensor. The isotropic magnetic field radiation monitor will simplify use of the apparatus and will provide more accurate electromagnetic field measurements while maintaining the cost effectiveness of the apparatus.

BRIEF DESCRIPTION OF THE DRAWINGS

These and other objects and advantages of the invention will become apparent upon a further reading of the detailed description in conjunction with the drawings, wherein:

FIG. 3 is a schematic diagram of a sawtooth waveforms generated from various electrical/electronic equipment, indicating the complex nature and frequency content of magnetic fields to be detected;

FIG. 4 shows the magnetic fields generated and emitted by a VDT for example, wherein various magnetic fields are generated in planes perpendicular to one another;

FIG. 5 is a graph showing the output of a multi-turn sense coil which is directly proportional to the frequency of a simple magnetic field to be measured;

FIG. 9 indicates the output of the detection circuit indicating frequency compensation for the sense coil used to detect a magnetic field;

FIG. 10A-B show various sense coil configurations usable in the invention;

FIG. 11 shows a sense coil used in an alternate embodiment of the invention; and FIG. 12 shows a general schematic circuit representation of an alternate embodiment of the invention being an isotropic magnetic field radiation monitor.

DETAILED DESCRIPTION OF THE INVENTION

Figure 1A:
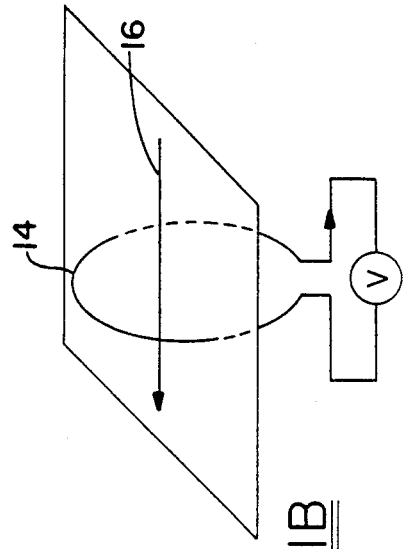
FIG. 1A is diagrammatic representation of a produced magnetic field generated from a current carrying conductor.
Figure 1B:
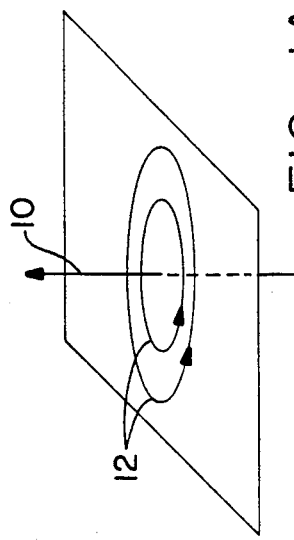
FIG. 1B is a diagrammatic representation of an EMF voltage which is produced in a coil placed in a magnetic field.

Referring to the drawings, FIG. 1a shows the generation of magnetic field from a current carrying conductor. It is well known that the passing of electrical current through a current carrying conductor will produce a magnetic field surrounding that conductor. As seen in FIG. 1a, a linear conductor 10 having current flowing therein in the direction shown by the arrow will generate a magnetic field indicated by the lines of magnetic flux 12, which are perpendicular to the direction of the electric current. It should be recognized that an alternating current through conductor 10 will produce an alternating magnetic field at the same frequency. The magnetic flux generated by the current carrying conductor is a function of the magnetic flux density, B, which is directly proportional to the current passing through the conductor 10. The magnetic flux density B is a vector quantity, and is usually represented in units of Webers/meter 2, or Tesla (T), wherein the magnetic flux, $\phi$, is defined by the integral $$\phi = \int B \cdot ds = B \times A$$

where ds is the differential surface area of a sensing coil and A is the area that the coil encloses. As seen in FIG. 1b, a coil 14 immersed in a magnetic field 16 will have generated therein, an EMF voltage, which is equal to the number of turns of the coil, times the rate of change of flux through the coil.

Figure 2:
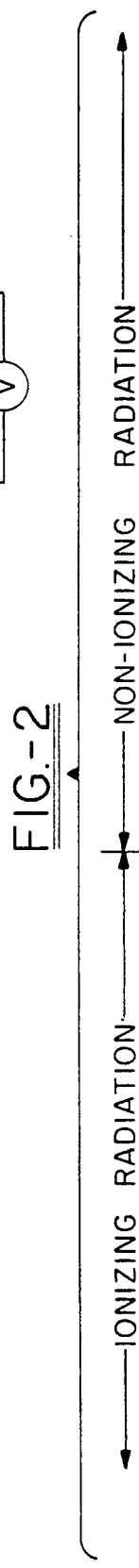
FIG. 2 shows the electromagnetic spectrum and indicates the frequency and wavelength of various electromagnetic radiation across the spectrum.

Turning now to FIG. 2, the electromagnetic spectrum is indicated in terms of frequency and the wavelength of electromagnetic radiation. As indicated in FIG. 2, the electromagnetic spectrum is comprised of both ionizing radiation which will change atoms into charged particles, and non-ionizing radiation such as radio waves and visible light. Within the non-ionizing radiation portion of the spectrum, there is included the long electric/magnetic oscillations comprising the VLF and ELF frequencies which extend from tens of Hz to approximately 200,000 Hz. More specifically, ELF fields generally range from approximately 1 to 1000 Hz., while VLF fields range from approximately 10 to 500 KHz. Alternating magnetic fields within these low frequency ranges are the types which have been linked to possible adverse biological effects, and the monitor of the invention is designed to detect the strength of such fields over these discrete frequency ranges. As mentioned previously, almost all electrical/electronic equipment using the alternating current power source may emit some level of electromagnetic radiation. The magnetic fields generated in the vicinity of power transmission lines and transforming equipment have been recognized, but also almost any device which is using AC power will produce magnetic fields at the frequency of approximately 60 Hz. in North America. Although many devices may produce magnetic fields at or about the frequency of the power source, some devices will emit electromagnetic fields at frequencies of other than the source frequency. For example, television monitors and video display terminals include electron deflection coils within the CRT of the equipment which will emit pulsed magnetic fields associated with the horizontal and vertical deflection of the electron beam. As seen in FIG. 3, the waveforms generated from such equipment may include multiple frequency components generating magnetic fields of complex nature. As an example, a CRT will generate a sawtooth wave form 20 from the vertical deflection coil of the CRT, which will have a fundamental frequency of 60 Hz., but also includes harmonics and frequency content extending beyond the fundamental frequency. For the horizontal deflection coil, a similar sawtooth waveform will be generated, but will have a fundamental frequency of approximately 16,000 Hz., again including frequency content extending beyond such fundamental frequency. As VDT technology improves to increase the image resolution and performance, these frequencies can vary greatly beyond those fundamental frequencies mentioned. It should be recognized that with VDTs and a variety of other devices, both ELF and VLF magnetic fields may be generated which have a wide frequency content, wherein such distinct fields must be separately monitored. The measurement apparatus must have a wide frequency response to accommodate variations in the generated fields. As seen in FIG. 4, a television monitor 24 having vertical and horizontal deflection coils 26 associated with a CRT 28 will generate magnetic fields as seen in FIG. 4. The vertical deflection coil will generate a generally horizontal magnetic field 30 while the horizontal deflection coil will generate a generally vertical magnetic field 32, both extending outwardly from the monitor 24.

As mentioned previously, magnetic fields may be detected and measured by use of a multi-turn coil placed in the alternating magnetic field which will have induced therein an EMF which is proportional to the rate of change of flux therethrough. This may be represented as:

$$E = N \times d\phi/dt$$

where E is the induced EMF voltage, N is the number of turns of insulated thin wire in the coil, and $\phi$ is the magnetic flux linkage. This may be reduced to the representation $$E = NAa\omega$$

where A is the area that the coil encloses, a is the amplitude of the magnetic field and $\omega$ is the angular velocity dependent upon the frequency of the alternating magnetic field. While the use of a sense coil is desired, the detection of a magnetic field may also be accomplished by a Hall probe which will measure the magnetic flux density in which the probe is placed. The Hall probe includes a current carrying conductor in which an EMF is generated when placed in a transverse magnetic field, wherein the voltage produced is directly proportional to the magnetic flux density. The Hall effect is present in both conductors and semi-conductors, although much larger EMFs are generated in semi-conductor materials. Hall effect sensors can be utilized in the embodiments of the invention as desired.

The use of a multi-turn coil as the magnetic sensor in a measuring device is simple and low cost, however the EMF produced is directly proportional to the rate of change of flux or frequency of the magnetic field to be measured which is represented in FIG. 5. In FIG. 5, it is seen that the coil output in volts is directly proportional to the frequency of the alternating magnetic field. Because of the coils frequency dependency, a difficulty arises in that if the magnetic field is of a complex nature and includes multiple frequency components, accurate assessment of the strength of the field is inhibited if the frequency of the magnetic field is unknown which will normally be the case. If a measuring instrument is calibrated for a given frequency magnetic field, it will only reflect accurate measurements of a magnetic field at that frequency. The magnetic waveforms produced by VDTs for example are not of a given frequency and carry many harmonics which will result in erroneous measurement if not compensated for properly.

Figure 6:
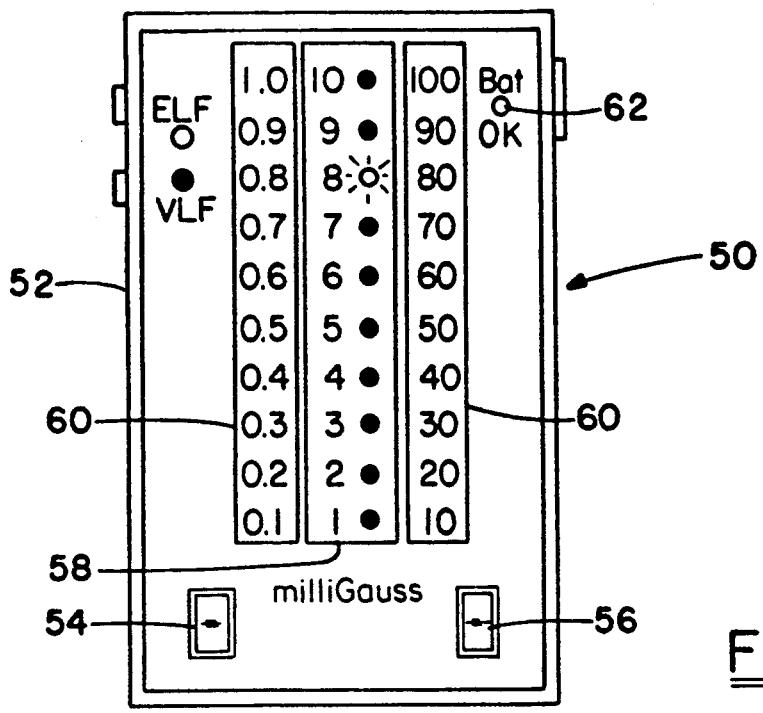
FIG. 6 shows a top view of the magnetic field radiation monitor of the invention.

A magnetic field radiation monitor of the invention is shown generally at 50 in FIG. 6, and includes a housing 52 being a small, portable, hand-held device. The monitor 50 includes a selection switch 54 adapted to select a detection of ELF or VLF magnetic fields. An on-off switch 56 also is adapted to select both high and low sensitivity positions to yield the proper indication of the measured field. A display means 58 may comprise a series of LEDs indicating the strength of the detected magnetic field in milligauss as well as active scales 60 indicating the strength of the detected magnetic field. A battery check LED 62 may be provided or a variety of other possible enhancements such as the use of a digital display or the like.

Figure 7:
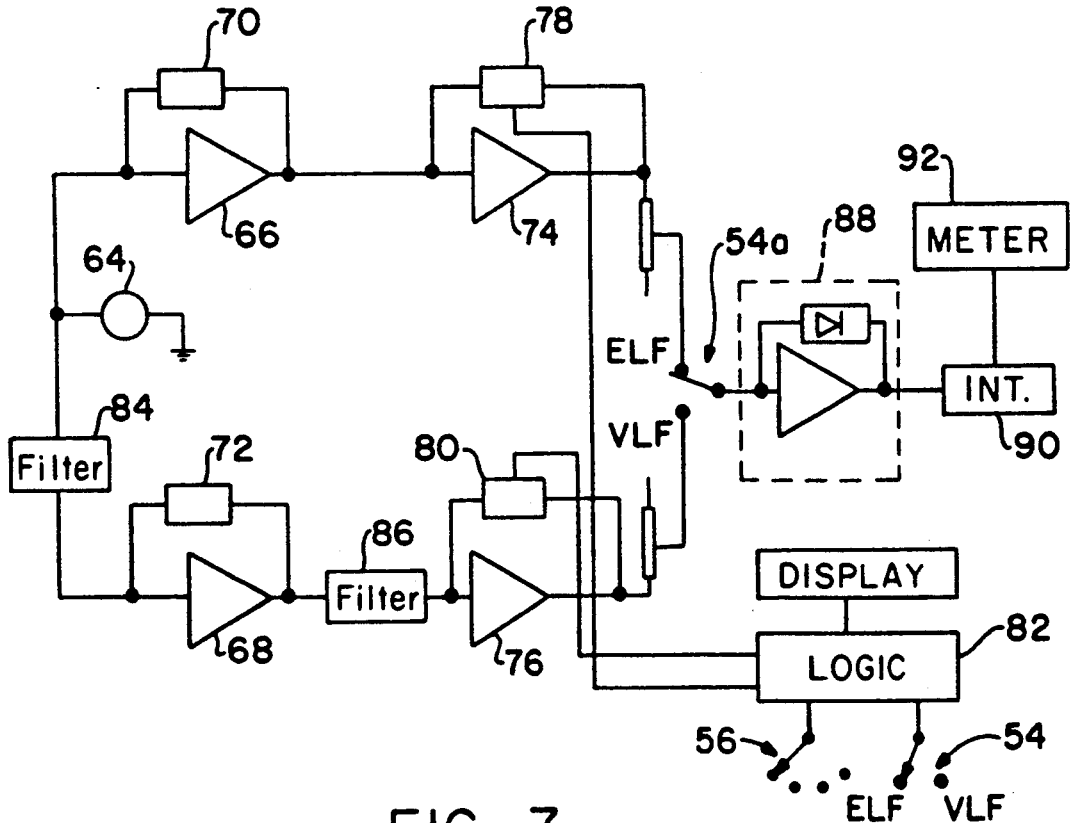
FIG. 7 shows a generally schematic circuit diagram for the magnetic field radiation monitor of the invention.

Turning to FIG. 7, a simplified schematic diagram for the monitor of the invention is shown. In this embodiment of the device, a sense coil 64 is positioned within a magnetic field and the flux therethrough is sensed for both the ELF and VLF fields. The EMF voltage generated in coil 64 is amplified, which for the measurement of ELF fields will include an amplifier stage 66 or for VLF measurements an amplifier stage 68. Each of the amplifier stages 66 and 68 include a feedback element 70 and 72 respectively which are designed such that the voltage gain of this amplification stage has a frequency verses output response which exactly matches and is opposite of the frequency dependent output response of the sense coil 64. The frequency compensation achieved in this stage of the measurement circuit ensures the integrity of the signal produced by the magnetic field for accurate assessment of the magnetic field strength. The frequency compensation of the circuit will be described in more detail hereinafter. The signal for either the ELF or VLF fields detected is further amplified by amplification stages 74 and 76, which also include feedback loops 78 and 80. The gain of this amplification stage is adjustable by a logic block 82 coupled to the ELF/VLF selection switch 54 and sensitivity selector switch 56 of the device. The logic block 82 is coupled to the feedback elements 78 and 80 of the second amplification stage, wherein the input to the logic stage 82 may either be through the user gain selector switch 56 or by means of an automatic scaling circuit. It is also noted that the VLF measuring stage of the circuit includes filter stages 84 and 86 which shape the frequency response detected thereby and rejects ELF signals for proper discrimination therebetween.

Again, the feedback loop element 72 will provide frequency compensation in the VLF section. An additional filtering stage is provided at 86 after the first stage of amplification and frequency compensation in the VLF section. The ELF/VLF selection switch 54 will also act to couple the desired section of the measurement circuit to a precision rectifier circuit 88, which will provide full-wave rectification of the received signals. Rectification of the signal will insure accuracy of signal interpretation across a wide signal level range as desired. The rectifier circuit 88 should have a frequency response which will accommodate both ELF and VLF frequencies, thereby minimizing circuit components and complexity. The output of the rectifier circuit 88 is fed to an integrating circuit for signal processing prior to measurement and display. The output of the integrator 90 may then be displayed on a suitable meter 92, to give an indication of the magnetic field strength measured at the location of the device.

Figure 8:
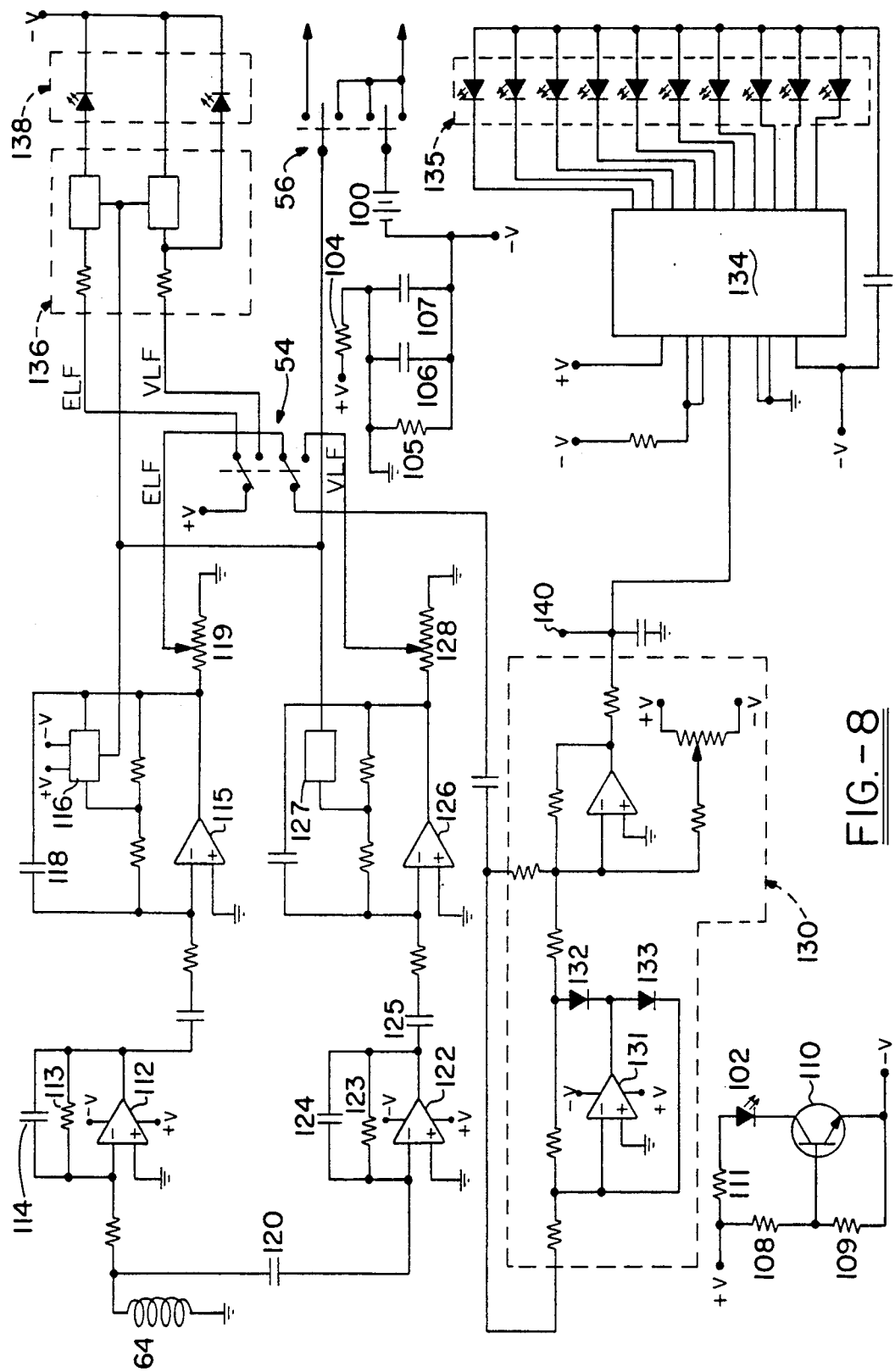
FIG. 8 shows a more detailed circuit schematic for the monitor of the invention.

A measuring circuit which may be utilized with the magnetic field radiation monitor is shown in FIG. 8, wherein the portable hand-held monitor is designed to utilize a 9 volt battery 100, although the circuit can be designed for other types of batteries. A 9 volt power supply has been found to provide large enough supply voltages for the op-amp circuits without sacrificing performance. The power on switch 56 may be a double-pole, double-throw switch which is of the momentary type to insure that the device is not left on accidentally. Alternatively, a power supervision circuit may be provided to automatically turn the device off after a short period. An LED as shown at 102 will be charged to indicate the battery "OK" status while power is being applied by the momentary switch 56. The battery check circuit includes a divider network comprising resistors 108 and 109 which provide a threshold voltage for the battery status LED 102 through transistor 110. A limiting resistor 111 acts to limit the current through the LED 102 and transistor 110. In this way, if the battery's output drops below the threshold voltage, the battery "OK" LED will not turn on when power is applied. The battery may then be replaced or a recharging circuit may be provided for rechargeable type batteries. To utilize a single 9 volt battery 100 in op-amp circuits requiring dual voltage lines, a divider network comprising resistors 104 and 105 provide an op-amp reference point such as a zero volt reference which is supplied to the op-amp circuits. Capacitors 106 and 107 provide the proper bypass path for the op-amps in the circuit. Once power is applied to the circuit using momentary switch 56, the output of the coil 64 is fed to either the ELF or VLF section of the circuit via double-pole, double-throw selection switch 54 in the circuit. In the ELF section, the output of the coil is fed to op-amp 112 which includes a feedback loop consisting of a resistor 113 and capacitor 114 which provide the proper gain verses frequency response to counteract the frequency dependent output of sense coil 64. The output of the op-amp 112 including the feedback loop has a flat frequency verses gain response. The output of op-amp 112 is directed to second op-amp 115 which provides a further stage of amplification, wherein the gain of the stage can be varied by the CMOS switch 116. The switch 116 when activated will provide a low resistance path in the feedback loop of op-amp 115 in combination with resistor 117, providing a gain reduction of 10 to 1 or another pre-selected value. Additionally, in the feedback loop of op-amp 115, there may be provided a capacitor 118 which limits the frequency response of the amplification stage to the range of ELF frequencies desired, such as between 50 to 1000 Hz. The output of the op-amp 115 may then be fed to a multi-turn potentiometer 119 which can be used to adjust the output level of the ELF stage during the calibration process.

The VLF stage of the circuit is similar in some respects to the ELF stage, and is fed from coil 64 through a capacitor 120 to filter a portion of the signal relating to ELF frequencies. This signal is fed to op-amp 122 having a feedback loop comprising resistor 123 and capacitor 124 which provide the proper gain verses frequency response to yield a flat frequency response from this stage. The output of op-amp 122 is fed through a second filtering capacitor 125 which will filter the major portion of any ELF frequencies remaining, and then be directed to op-amp 126. The feedback loop of the op-amp 126 is similar to that of the ELF stage, and may comprise a CMOS switch 127 and associated circuit components similar to that previously described. Again a multi-turn potentiometer 128 may be used to adjust the output during calibration.

The selected output of the ELF or VLF stage using selection switch 54 will then be fed to the precision rectifier stage 130, which provides full wave rectification of the signals down to the millivolt level, and may comprise an op-amp 131 in combination with diodes 132 and 133. The use of op-amp 131 in the rectifier circuit 130 eliminates the diode threshold voltage which may be present in a diode only rectifier. The precision rectifier 130 also provides additional gain, and the output of this stage will normally be a pulsating direct current value. The output is filtered and fed to the LED display voltmeter driver integrated circuit 134. It should be recognized that any type of high-impedance volt meter may be used, and any type of display device provided to give indication of the measured field. The monitor may utilize many different display devices including various types of numerical displays such as liquid crystal displays, LEDs or other types of displays. The LED driver 134 provides a simple and cost effective design which utilizes a precision voltage reference source, voltage level comparators and the LED drivers in a single integrated circuit. A plurality of LEDs 135 are used to give an indication of the measured field strength.

The circuit also comprises a CMOS switch 136 coupled into the circuit via switch 54. The switches 116,127 and 136 together provide simple logic functions by combining the input of the sensitivity selection switch 56 and ELF/VLF selection switch 54 to set the proper gain for each stage in the circuit and to illuminate the appropriate scale LED 138. The CMOS switches 116 and 127 are utilized to control the gain of OP amps 115 and 126 respectively. Upon switching of sensitivity switch 56, the respective CMOS switches 116 and 127 are selectively turned on or off to change the resistances in the OP amp circuits so as to increase or decrease the gain of OP amps 115 and 126. For example, if the CMOS switches 116 and 126 are turned off, one resistance is cut out of the respective OP amp circuit 115 or 126 so as to lower the gain. The CMOS switch 136 provides a simple logic function to provide the proper signal for lighting the proper LED 138.

In calibration of the measuring circuit, the sense coil 64 is positioned within a known magnetic field within the ELF or VLF range, and the output of the measuring circuit is adjusted to insure accurate field strength indications. A Helmholtz coil may be provided to generate a uniform magnetic field, wherein the monitor may be placed in the center of a pair of Helmholtz coils such that the instrument sensed coil 64 is parallel to the Helmholtz coils. A calibration probe may be coupled to the circuit at 140, and the multi-turn potentiometers 119 and 128 may be used to adjust the output level of the ELF and VLF stages respectively.

An important aspect of the measuring circuit is to provide sense coil frequency compensation which will eliminate the frequency dependency of the instrument, such that the instrument may provide true and accurate indications for a variety of fields including simple fields having a discrete frequency component as well as complex fields with multiple frequencies and harmonics. The feedback loops of the initial op-amps 112 and 122 in the ELF and VLF stages respectively provide an equal but opposite output response which will normalize the frequencies and provide a flat frequency response. As seen in FIG. 9, the coil output 150 is matched by an opposite gain function 152 to yield a resultant frequency response 154 which is substantially flat. As an example, the sense coil may have an output response of 6 dB per octave, and the frequency compensation provided by feedback loops associated with the op-amps 112 and 122 will provide a minus 6 dB per octave output desired. The frequency compensation provided will insure the integrity of the signal produced by the magnetic field for accurate assessment of its strength.

Turning now to FIG. 10, various embodiments of a suitable sense coil which may be used in a monitor are described. The sense coil is preferably constructed from thin enameled wire which is tightly and uniformly wound around a bobbin. The bobbin core should be hollow or of an appropriate ferrite material. In FIG. 10A, a rectangularly shaped coil 160 is formed to enclose the desired area. The rectangularly shaped coil 160 may be adapted to fit around a printed circuit board holding the electronic circuitry previously described. With a sense coil of a configuration in FIG. 10A, problems may arise if the coil is not properly oriented within a magnetic field to be measured. It is known that magnetic fields are generally highly polarized, with the direction of the lines of magnetic flux determined by the generating source. For example, the ELF and VLF magnetic fields generated by a VDT have planes perpendicular to each other, and generally oriented in the horizontal and vertical planes as previously described. The EMF generated in the sense coil 160 is at a maximum when the coils cross-section is perpendicular to the lines of magnetic flux. This implies that the instrument has to be held in a certain orientation for the maximum reading of a given field. The sense coil 116 may be packaged with the electronic circuit of the instrument in the best orientation for reading of the desired ELF or VLF field. Rectangular coil 160 allows the ELF field of a VDT to be read when the instrument is flat and the operator directly faces the display monitor. The device may be simply rotated 90° to effectively measure the VLF field of the display device. Alternatively, a circular sense coil 162 as indicated in FIGS. 10B, may be provided for similar operational characteristics. In FIG. 10C and 10D, sense coil configurations 164 and 166 may comprise a pair of coils which are oriented perpendicularly with one another to allow the instrument to be simply oriented in a flat position with one or another of the coils being properly oriented relative to the desired ELF or VLF field to be measured. The measurement circuit may then be adapted to discriminate against any spurious signals received by the respective coil which is not properly oriented to provide a true and accurate reading of the field measured.

In an alternate embodiment of the invention, the magnetic field monitor is desirably designed to provide isotropic magnetic field measurements, which are not dependent upon the direction in which the instrument is oriented. By providing an isotropic or non-directional design, the use of the monitor is simplified to a great extent and at the same time increases the detection accuracy thereof. The isotropic device therefore does not require rotation of the instrument within a magnetic field to be measured to insure proper and accurate measurements of a field. A more precise measurement of the magnetic field may be obtained by orienting a non-isotropic instrument in three different orientations which are perpendicular to one another. The individual measurements taken in each orientation may be vectorially added by the user to achieve the total vector sum of the magnetic field at that location. Such a procedure is unsuitable for consumer use and is not practical for the general non-scientific user. To achieve the isotropic design of the instrument, a tri-axis magnetic sensor 170 as shown in FIG. 11 may be used. The isotropic sensor 170 comprises a combination of at least three individual coil sensors 171, 172 and 173 which have their axes perpendicular to one another. Each of the coils 171-173 are designed with identical turns and wire lengths such that the output response of each individual coil will be equivalent when placed in a known field and at the same orientation. Similarly Hall effect sensors can be arranged and utilized in the same manner. With the sensing coil configuration 170, when the sensor is placed within a magnetic field, each coil will produce an EMF corresponding to the magnetic flux density vector for that axis. In the measuring circuit, the amplified EMF signals from each coil 171-173 may be sampled separately and processed to determine the total magnetic flux density. The vector sum of the magnetic flux densities for each of the coils 171-173 may then be determined and the resultant magnetic flux density may then be displayed on the instrument and/or communicated via a serial link to a remote computer to be stored.

As seen in FIG. 12, the measurement circuit for this embodiment of the invention is similar in some respects to the embodiment of FIG. 7. Each of the separate coils in sense coil 170 feeds a separate amplification and frequency compensation stage 174, 175 and 176 respectively similar to that previously described. This will produce a flat frequency verses gain response for both the ELF and VLF ranges from each of the coils as desired. The gain of these stages are adjustable as will be hereinafter described. The output of each of the amplification stages 174-176 is fed to a multiplexer 178, which is controlled for sampling of each coils output at a pre-selected rate. The selector switch 180 will feed the multiplexed output to either filter stage 182 or 184 for ELF or VLF measurement. The filters 182 and 184 provide frequency selection and optimization for the desired ELF or VLF frequencies, and the output is fed to a signal processing stage 186. In both embodiments of the invention, the output of the amplification and frequency compensation stages, may be fed to processing stage which will provide true RMS detection of the measured field. The signal processing stage 186 will convert the alternating current from the filter stages 182 or 184 to a direct current value, which may be accomplished by a true RMS detection circuit. The true RMS detection will give an accurate measurement of the magnetic energy content in complex waveforms, such as the sawtooth waveforms generated by CRTs. The conversion to a direct current true RMS value of the alternating current signals will give a more accurate assessment of complex waveforms. The direct current value generated thereby is then fed to an analog to digital converter 188. The digital value produced will then be fed to a microprocessor 190 wherein the vector sum of the magnetic flux densities from each coil in sense coil 170 is derived by adding the cubes of individual magnetic flux densities from each coil and taking the square root of the sum. A single chip microcomputer such as the Motorola MC68HC11 may also be suitable for this purpose. The microprocessor may be utilized to adjust the gain of the amplification stages 174-176 to provide automatic ranging over several decades of gain. The microprocessor may also include the analog to digital converter 188 as well as a read only memory (ROM) for the program storage, random access memory (RAM) and input/output drivers. The microprocessor 190 will automatically sample the output of each coil, and calculate the vector sum of flux density for that location. The measurements can be displayed on a display device 192, such as a numerical liquid crystal display for low power consumption or any other display type as desired. The output may also be stored on the RAM or communicated to a host computer at a remote location as indicated at 194 for further analysis.

The isotropic magnetic field radiation monitor allows a user to simply position the instrument within the magnetic field in any orientation, and quickly and easily determine the field strength at that location. The device may provide a true RMS platform in either the isotropic or non-isotropic embodiments, to yield true and accurate measurements. In the isotropic embodiment, as the orientation of the sense coil within the magnetic field is of no consequence, the measuring instruments may be integrated into a watch or simply attached to a belt clip of the user or otherwise worn by the user. The output of the measuring circuit may then be compared with a predetermined threshold voltage, wherein upon exceeding the threshold an alarm 196 could be initiated to indicate that the user is exposed to potentially hazardous magnetic field radiation. Additionally, the output signal of the measurement circuit could be integrated due to the ability of the micro-processor to keep time and sample and store in memory the field strengths at predetermined intervals such that an alarm would sound if exposed to hazardous levels of magnetic field radiation for a predetermined amount of time.

While preferred embodiments of the invention have been described herein, it will occur to those skilled in the art that a variety of changes or modifications can be made. The various components of the measurement circuits herein may be modified to some degree while maintaining the desired characteristics thereof. A fully integrated circuit design is desired, which has been found to be quite cost-effective. The magnetic field radiation monitor provides an indication of the power content of a magnetic field and not the peak value thereof, eliminates the frequency dependency of a sense coil and allows true and accurate measurements of both ELF and VLF signals. It is also noted that in the isotropic embodiment of the invention, the conversion of the filtered AC signal to a direct current value may not be necessary as the AC waveform could be adequately sampled in an A to D conversion and subsequently processed by the microprocessor 190. The conversion of the AC signal to a digital value also would enable the field strength to be interpreted in several different ways including peak detection, average detection, RMS detection, the rate of change of the magnetic field or the like. Alternatively, the instrument could be programmed to take measurements at predetermined times of day and store the information for retrieval at a later time or may be fed directly to a remote computer to continuously monitor a particular environment and enable unattended operation of the meter. The microcontrolled isotropic principles as set forth in the invention may also be applied to electric field measurements wherein the remote unattended operation of an electric field monitor will eliminate the possible adverse effects of a human body close to the instrument at the time of measurement. Accurate electric field measurements may also be obtained using some of the advantages of the monitor herein. It is apparent that a wide variety of modifications could be made without departing from the spirit and scope of the invention as defined in the appended claims.

What is claimed is:

1. A portable magnetic or electric field radiation measurement apparatus for measurement of radiation in the extremely-low-frequency (ELF) and very-low-frequency (VLF) ranges to which a person may be exposed, comprising:
   a sensing means positioned within magnetic or electric fields in the extremely-low-frequency (ELF) or very-low-frequency (VLF) ranges which are emitted from electronic equipment, said sensing means generating a first signal proportional to the strength of said fields,
   measurement circuit means coupled to said sensing means for developing an output signal indicative of the strength of said magnetic or electric fields in a selected one of the ELF or VLF ranges, said measuring circuit means including at least two discrete signal processing circuits, and means for frequency compensation of said first signal generated by said sensing means, wherein said means for frequency compensation will produce a second signal having a substantially flat frequency response over said selected one of the ELF or VLF ranges respectively, at least one of said processing circuits for processing signals of a frequency within the ELF range, and at least one of said processing circuits for processing signals of a frequency in the VLF range,
   said measurement circuit means further including switch means to select the output from one of said at least two processing circuits for processing of said second signal to measure fields in said selected one of said ELF or VLF ranges and generate said output signal, wherein each of said at least two processing circuits includes means to discriminate against signals outside of the selected ELF or VLF frequency ranges respectively so as to allow measurement of fields in the selected one of the ELF or VLF frequency ranges to determine exposure levels of a person in said fields of the selected frequency range, and
   indicating means coupled to said at least two processing circuits through said switch means to provide an indication of the strength of the field detected.

2. The apparatus of claim 1, wherein,
   said at least two discrete processing circuits measure discrete frequency ranges in the extremely low frequency (ELF) range between 1 Hz and 2,000 Hz, and the very low frequency (VLF) range between 10 and 500 KHz respectively.

3. The apparatus of claim 1, wherein,
   said sensing means comprises at least one sense coil adapted to sense magnetic flux from an electromagnetic field to be measured, wherein said first signal is an EMF voltage generated within said sense coil upon placement thereof into a magnetic field, and
   said at least one sense coil will produce said first signal which will be a frequency dependent signal and said means for frequency compensation will combine with said first signal a frequency dependent output signal which has a gain versus frequency response which is oppositely matched to said first signal to produce said second signal.

4. The apparatus of claim 3, wherein,
   said sense coil is formed from multiple turns of wire, wherein said coil is adapted to lie substantially within a plane, and encloses a predetermined area, wherein an EMF voltage induced therein by a magnetic field will be proportional to the number of turns of wire in the coil and the area enclosed thereby.

5. The apparatus of claim 3, wherein,
   said sense coil is constructed to have two discrete multi-turn coils, wherein each of the coils is formed to lie substantially in a plane and to enclose a predetermined area, wherein the coils are oriented substantially perpendicularly to one another and an EMF voltage induced in each coil by a magnetic field will be proportional to the number of turns of wire in each coil and the area enclosed thereby.

6. The apparatus of claim 1, wherein,
   said second signal is an alternating current signal which is fed to a rectification stage in said measurement circuit means to produce a direct current signal said direct current signal being fed to a signal processing means from which said output signal is generated.

7. The apparatus of claim 1, wherein,
   said measuring circuit means further includes a switch means for selecting the sensitivity of said measuring circuit which cooperates with amplification stages included within each of said at least two discrete processing circuits of said measurement circuit means, said switch means enabling the proper gain to be set for each amplification stage to yield the desired sensitivity in the indication of the strength of the field detected.

8. The apparatus of claim 1, wherein,
   said indicating means is a high impedance volt meter coupled to a suitable display means, wherein the output of said volt meter will produce an indication of the strength of the field detected on said display means.

9. The apparatus of claim 1, wherein,
   said indication means is an alarm which is activated upon the output voltage of said measuring circuit means exceeding a predetermined threshold voltage, wherein said predetermined threshold voltage relates to a level of field radiation which is potentially harmful.

10. The apparatus of claim 1, wherein,
    said measurement circuit means provides a true RMS measuring circuit to generate a true RMS voltage proportional to the strength of a field detected.

11. The apparatus of claim 1, wherein,
    said sensing means is a Hall Effect sensor including a semi-conductor material having a current flowing therein in a direction perpendicular to a magnetic field to be detected, wherein a voltage produced thereby will be directly proportional to the magnetic flux density of said magnetic field.

12. The apparatus of claim 1, wherein, said sensing means comprises an electric field sensor which will generate a signal proportional to the electric flux density passing through said sensor to give an indication of the strength of the electric field detected.

13. An isotropic magnetic field measuring apparatus for detecting and measuring alternating magnetic fields in the separate extremely-low-frequency (ELF) or very-low-frequency (VLF) frequency ranges which are potentially harmful to a person and to which a person may be exposed, comprising:

a sensing means including at least three individual sense coils, each of said coils having an axis which is substantially perpendicular to the axis of the other of said coils, wherein when said sensing means is positioned within a magnetic field to be measured in a selected one of said ELF or VLF ranges which are emitted from electronic equipment, each of said coils generate a first signal proportional to the rate of change of magnetic flux passing through each of said coils, measuring circuit means coupled to each of said coils and including multiplexing means to which said first signals from each of said sense coils are fed for sampling thereof to generate a multiplexed output, said measuring circuit means also including at least two discrete signal processing circuits, at least one of which measures the total strength of fields in the ELF range and at least one of which measures the total strength of fields in the VLF range, said measuring circuit means including switch means for selectively coupling said multiplexed output to a selected one of said processing circuits, each of said at least two processing circuits having separate means to discriminate against signals outside of a frequency range corresponding to the ELF or VLF range respectively and to separately process said multiplexed output to generate an output signal indicative of the total strength of the magnetic fields detected within the selected ELF or VLF range, wherein the multiplexed output will be fed to one of said at least two processing circuits which will derive the vector sum of the magnetic flux densities from each of said sense coils to yield an output signal proportional to the total strength of said magnetic field to be detected;

indication means coupled to each of said at least two processing circuits to provide an indication of the strength of the magnetic field detected.

14. The apparatus of claim 13, wherein, said measurement circuit means provides a true RMS measuring circuit to generate a true RMS voltage proportional to the strength of the magnetic field detected.

15. The apparatus of claim 13, wherein, each of said discrete processing circuits includes means to convert an alternating current output from said multiplexing means to a direct current output which is then converted to a digital signal, wherein said digital signal will be further processed to calculate the vector sum of the flux densities for each of said sense coils.

16. The apparatus of claim 13, wherein, said measuring circuit means further includes means for frequency compensation of said signals from each of said sense coils, said means for frequency compensation adapted to produce a modified signal having a substantially flat frequency response over a predetermined frequency range.

17. A portable magnetic or electric field radiation measurement apparatus for measurement of fields within the extremely-low-frequency (ELF) or very-low-frequency (VLF) ranges comprising:

at least one sensing coil means positioned within magnetic or electric fields in the ELF or VLF frequency range emitted from electronic equipment, the strength of which is to be measured, said sensing coil means generating a first signal proportional to the strength of said magnetic or electric field, measurement circuit means for developing an output signal indicative of the strength of said magnetic or electric fields in one of the ELF or VLF ranges, said measuring circuit means including a frequency compensation stage to generate a second signal having a substantially flat frequency response over said ELF or VLF ranges, and at least two discrete signal processing circuits having means for discriminating against signals outside of a selected one of the ELF or VLF frequency ranges such that at least one of said signal processing circuits measures the strength of fields in the ELF range and at least one of which measures the strength of fields in the VLF range, said measurement circuit means including a switch to couple said second signal to one of said signal processing circuits to generate said output signal, and indicating means coupled to said at least two processing circuits to provide an indication of the strength of the field detected.

18. The apparatus of claim 17, wherein, a plurality of multi-turn coils are provided, and said measurement circuit means include a separate frequency compensation stage for each of said plurality of coils.

19. The apparatus of claim 18, wherein, each of said separate frequency compensation stages in said measurement circuit means produces a signal which is fed to a multiplexing means adapted to sample each of the signals generated by said frequency compensation stages, wherein the sampled outputs from each of said plurality of coils is then fed to a microprocessor to generate said output signal.

20. The apparatus of claim 17, wherein, said at least two discrete processing circuits measure discrete frequency ranges in the extremely low frequency (ELF) range between 1 Hz and 2,000 Hz, and the very low frequency (VLF) range between 10 and 500 KHz respectively.

21. The apparatus of claim 17, wherein, said measurement circuit means provides a true RMS measuring circuit to generate a true RMS voltage proportional to the strength of the field detected.

22. The apparatus of claim 17, wherein, at least two sense coil means are provided, wherein each of said coils is formed to lie substantially in a plane and to enclose a predetermined area, with the coils being oriented substantially perpendicularly to one another.

* * * * *